(12) United States Patent
Nelson et al.

(10) Patent No.: US 7,477,501 B2
(45) Date of Patent: Jan. 13, 2009

(54) SYSTEM AND METHOD OF MOUNTING CURRENT TRANSDUCERS IN PROXIMITY TO CIRCUIT BREAKERS

(75) Inventors: Gregg J. Nelson, Delaware, OH (US); Gerald R. Vlasak, Powell, OH (US); James K. Martin, Galena, OH (US); Jeffrey M. Powell, Lewis Center, OH (US)

(73) Assignee: Liebert Corporation, Columbus, OH (US)

( * ) Notice: Subject to any disclaimer, the term of this patent is extended or adjusted under 35 U.S.C. 154(b) by 445 days.

(21) Appl. No.: 11/420,784

(22) Filed: May 29, 2006

(65) Prior Publication Data

US 2006/0274481 A1 Dec. 7, 2006

Related U.S. Application Data

(60) Provisional application No. 60/686,664, filed on Jun. 2, 2005.

(51) Int. Cl.
| | |
|---|---|
| *H02H 3/08* | (2006.01) |
| *H02H 9/02* | (2006.01) |
| *H02H 3/00* | (2006.01) |
| *H02H 7/00* | (2006.01) |

(52) U.S. Cl. .................. 361/93.6; 361/62; 361/93.1; 361/93.3; 361/93.5

(58) Field of Classification Search ............ 361/62, 361/93.1, 93.3, 93.5, 93.6
See application file for complete search history.

(56) References Cited

U.S. PATENT DOCUMENTS

| | | | |
|---|---|---|---|
| 4,004,221 A | 1/1977 | Wilson | |
| 6,330,516 B1 | 12/2001 | Kammeter | |
| 6,637,564 B1 | 10/2003 | Vilas-Boas | |
| 6,713,997 B2 * | 3/2004 | Carlson et al. | ............ 324/74 |
| 6,809,509 B2 | 10/2004 | Bruno et al. | |

(Continued)

FOREIGN PATENT DOCUMENTS

JP 2003121476 4/2003

OTHER PUBLICATIONS

International Search Report for Corresponding International Patent Application No. PCT/US2006/020798.

(Continued)

*Primary Examiner*—Stephen W Jackson
*Assistant Examiner*—Dharti H Patel
(74) *Attorney, Agent, or Firm*—Locke Lord Bissell & Liddell LLP (57) ABSTRACT

The present disclosure provides a method and system for mounting a current transformer in proximity to a circuit breaker of an electrical system. Generally, a sensor assembly contains a plurality of current transformers (CTs) for measuring power wires from a main power supply. To accommodate measuring a greater number of wires than one sensor assembly can service, a plurality of sensor assemblies can be mounted end-to-end. The sensor assemblies can have symmetrical recessed portions that laterally align when mounted end-to-end by inverting one of the sensor assemblies. The lateral alignment allows CTs mounted lateral to the recessed portions to be aligned with corresponding circuit breakers, so that wires passing from the circuit breakers are aligned with the CTs, reducing bending stresses on the CTs in contrast to prior efforts. Changes in polarity caused by the inversion can be adjusted by software, firmware, hardware or a combination thereof.

26 Claims, 6 Drawing Sheets

U.S. PATENT DOCUMENTS

2003/0001702 A1 1/2003 Bach et al.
2003/0184279 A1 10/2003 Bruno et al.

OTHER PUBLICATIONS

Written Opinion for Corresponding International Patent Application No. PCT/US2006/020798.

International Search Report for Corresponding International Patent Application No. PCT/US2006/020800.

Written Opinion for Corresponding International Patent Application No. PCT/US2006/020800.

* cited by examiner

SYSTEM AND METHOD OF MOUNTING CURRENT TRANSDUCERS IN PROXIMITY TO CIRCUIT BREAKERS

This application claims the benefit of U.S. Provisional Patent Application No. 60/686,664 filed Jun. 2, 2005.

FIELD

This disclosure relates to electrical power systems. More specifically, the disclosure relates to methods for power distribution and electrical protection for electrical power systems.

BACKGROUND

In many premium power applications and power distribution systems, it is desirable to monitor individual branch circuit currents that distribute power from a main line to various circuit loads in an electrical system. An operator can be informed as to which connected loads are in operation, whether connected equipment is idling or fully operating, and whether any individual circuit is approaching overload and should be remedied.

In collecting data from many scattered circuit loads, current transducers (CTs) are often mounted in the system to gather current flow information. A typical mount is within the circuit breaker panel enclosure, where multiple branches from circuit breakers in the panel can be conveniently monitored from a single location. Thus, a main power supply enters the circuit breaker panel and the power is split into multiple branches having circuit breakers protecting each branch. The CTs are mounted electrically downstream of the circuit breakers in a long circuit board placed adjacent the circuit breakers. In many industrial or data center applications, the connected loads are rarely turned off to be serviced or repaired. Consequently, the reliability of the CTs with their respective board must be very high, since the CTs are toroidal in nature and cannot be removed without disconnecting circuit wiring and interrupting critical power to loads.

In application, relatively thick wire is fed from the electrical load into the circuit breaker panel, through the appropriate CT for a particular branch, and then into the contacts for the circuit breaker. However, there are several challenges. For example:

1. The standard 42-pole panel for circuit breakers has limited space within its housing, typically resulting in the CT board with the corresponding CTs being made long and thin and thereby mechanically weak. Stability and integrity of the system is compromised by the relative weakness of the CT board.
2. High voltage terminations at the individual circuit breaker outputs are very close to exposed current sensor soldered connections and thereby risk dangerous voltages entering the low-voltage control circuit wiring and destroying aspects of the electrical circuit and/or creating a safety hazard.
3. Typical CT boards require many extra soldered connections, directly lowering reliability and performance due to lack of mechanical strength.

Branch circuit monitors to date, such as those disclosed in U.S. Pat. Nos. 6,330,516 and 6,809,509, have been built on printed circuit boards and thereby posses the disadvantages listed above. The circuit board is thin and tends to flex as thick branch circuit wires pass through the mounted CTs and can break the soldered connections, seriously impairing the performance of the branch circuit monitor.

Figure 1A:
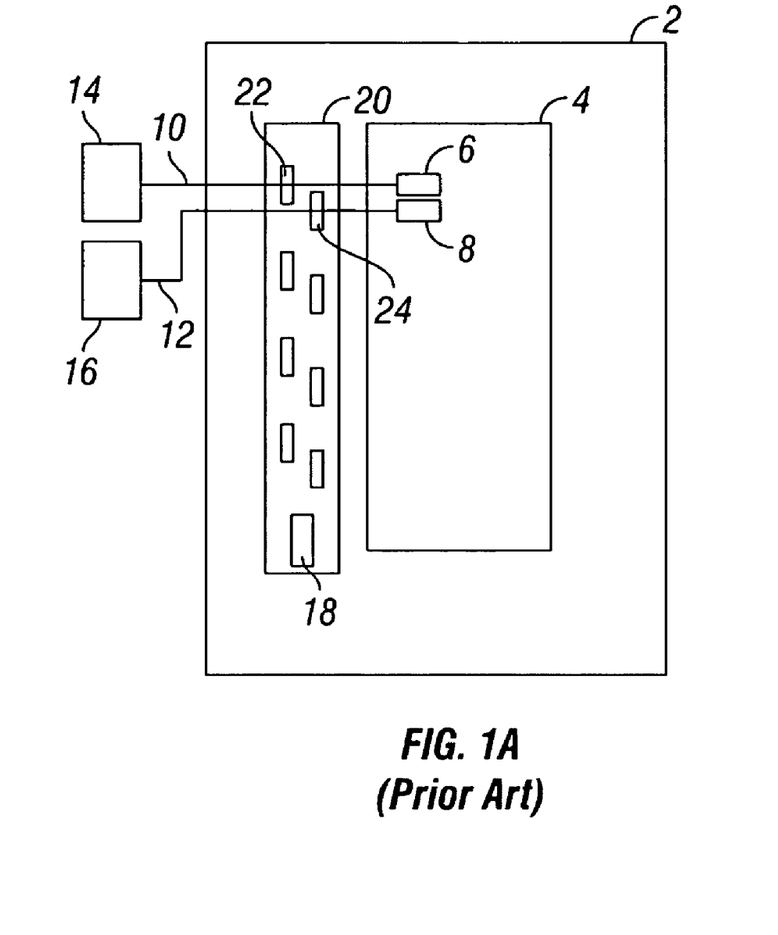
FIG. 1A is a schematic front view of an exemplary prior art electrical branch monitoring system.
Figure 1B:
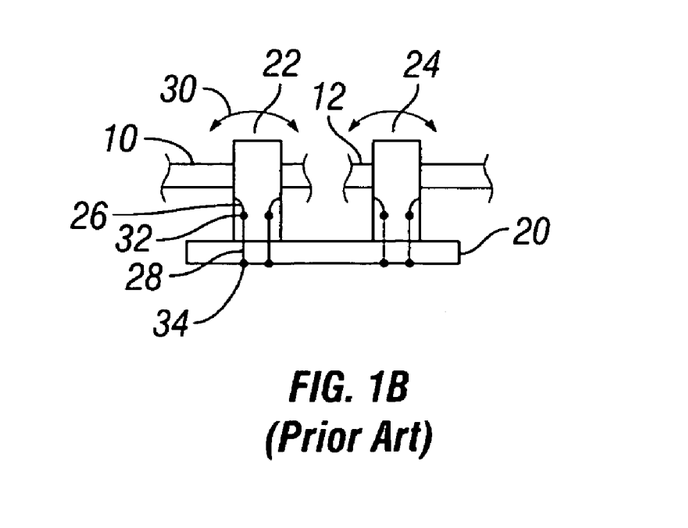
FIG. 1B is a schematic end view of the exemplary prior art electrical branch monitoring system of FIG. 1A.

For example, FIGS. 1A and 1B are schematic front and end views, respectively, of a prior art arrangement. A circuit breaker panel 2 contains a circuit breaker assembly 4 having a plurality of circuit breakers 6, 8. Conductive wires 10, 12 (relatively thick wires depending on the power requirements) feed power from the circuit breakers to loads 14, 16. A circuit board 20 having CTs 22, 24 mounted thereon is used to measure current of the wires 10, 12 passing through the CTs 22, 24 between the circuit breakers and the loads. The CTs can eventually connect to an output connector 18 starting with an output wire 26 from the CT coil wire that is soldered to a pin 28 at a soldered connection 32. The CT with the pin is assembled to the circuit board 20 by generally extending the pin 28 through a hole in the circuit board and soldering the pin to the circuit board at a soldered connection 34. The soldered connection 34 is in turn connected to a circuit board line (not shown) formed on the circuit board 20 that leads to another soldered connection at the output connector 18. A ribbon cable (not shown) can connect to the output connector 18 to carry output from the individual CTs to a monitoring system.

Each CT conductive path to the output connector has therefore three soldered connections and each CT has two wires for a total of six soldered connections per CT. Generally, there are 21 CTs on a circuit board for 21 circuit breakers, resulting in at least 126 soldered connections per board. For the modern trend of a circuit breaker panel having 42 circuit breakers in line, there are 252 soldered connections for such a typical circuit board branch monitoring system.

The bending stress 30 caused by pulling the thick wires 10, 12 through the CTs is concentrated on the CTs 22, 24 and its soldered connections, such as connection 28, resulting in damage to the unit and therefore the system, more frequently than is desirable. Also, connections on the circuit board are exposed to dangerous voltages from the relatively close wires 10, 12.

Therefore, there remains a need for improvement in the method of mounting and monitoring branch distribution power in such power applications and related systems.

SUMMARY

The present disclosure provides a method and system for mounting a current transformer in proximity to a circuit breaker of an electrical system. Generally, a sensor assembly contains a plurality of current transformers (CTs) for measuring power wires from a main power supply. To accommodate measuring a greater number of wires than one sensor assembly can service, a plurality of sensor assemblies can be mounted end-to-end. The sensor assemblies can have symmetrical recessed portions that laterally align when mounted end-to-end by inverting one of the sensor assemblies. The lateral alignment allows CTs mounted lateral to the recessed portions to be aligned with corresponding circuit breakers, so that wires passing from the circuit breakers are aligned with the CTs, reducing bending stresses on the CTs in contrast to prior efforts. Changes in polarity caused by the inversion can be adjusted by software, firmware, hardware or a combination thereof.

The disclosure provides a sensor assembly for wiring in an electrical system, comprising: a sensor support having a recessed portion formed on at least one end of the sensor support and adapted to interface with an adjacent sensor support having a symmetrical recessed portion so that the recessed portions laterally overlap when the sensor supports are mounted end-to-end; and a plurality of current transformers coupled to the sensor support, with at least one current transformer mounted lateral to the recessed portion, the current transformers having apertures adapted to allow wiring to pass therethrough in alignment with one or more circuit breakers mounted in proximity to the sensor support.

The disclosure also provides an electrical system, comprising: an electrical panel; a plurality of circuit breakers coupled to the electrical panel at an incremental spacing relative to each other; a first sensor support having a recessed portion formed on at least one end of the first sensor support; a second sensor support having a recessed portion formed on at least one end of the second sensor support and adapted to interface with the recessed portion of the first sensor support by inverting the second sensor support to allow lateral alignment of the recessed portions when the sensor supports are mounted end-to-end adjacent each other; and a plurality of current transformers coupled to the sensor supports, with at least one current transformer mounted lateral to at least one recessed portion of the first and second sensor supports, the current transformers having apertures adapted to allow wiring to pass therethrough in alignment with corresponding circuit breakers at the incremental spacing when mounted in proximity to the sensor supports.

BRIEF DESCRIPTION OF THE DRAWINGS

A more particular description, briefly summarized above, may be had by reference to the embodiments illustrated in the appended drawings, forming part of the present specification and described herein. It is to be noted, however, that the appended drawings illustrate only some embodiments described herein and are therefore not to be considered limiting of the disclosure's scope, in that there can be other equally effective embodiments.

DETAILED DESCRIPTION

Figure 2:
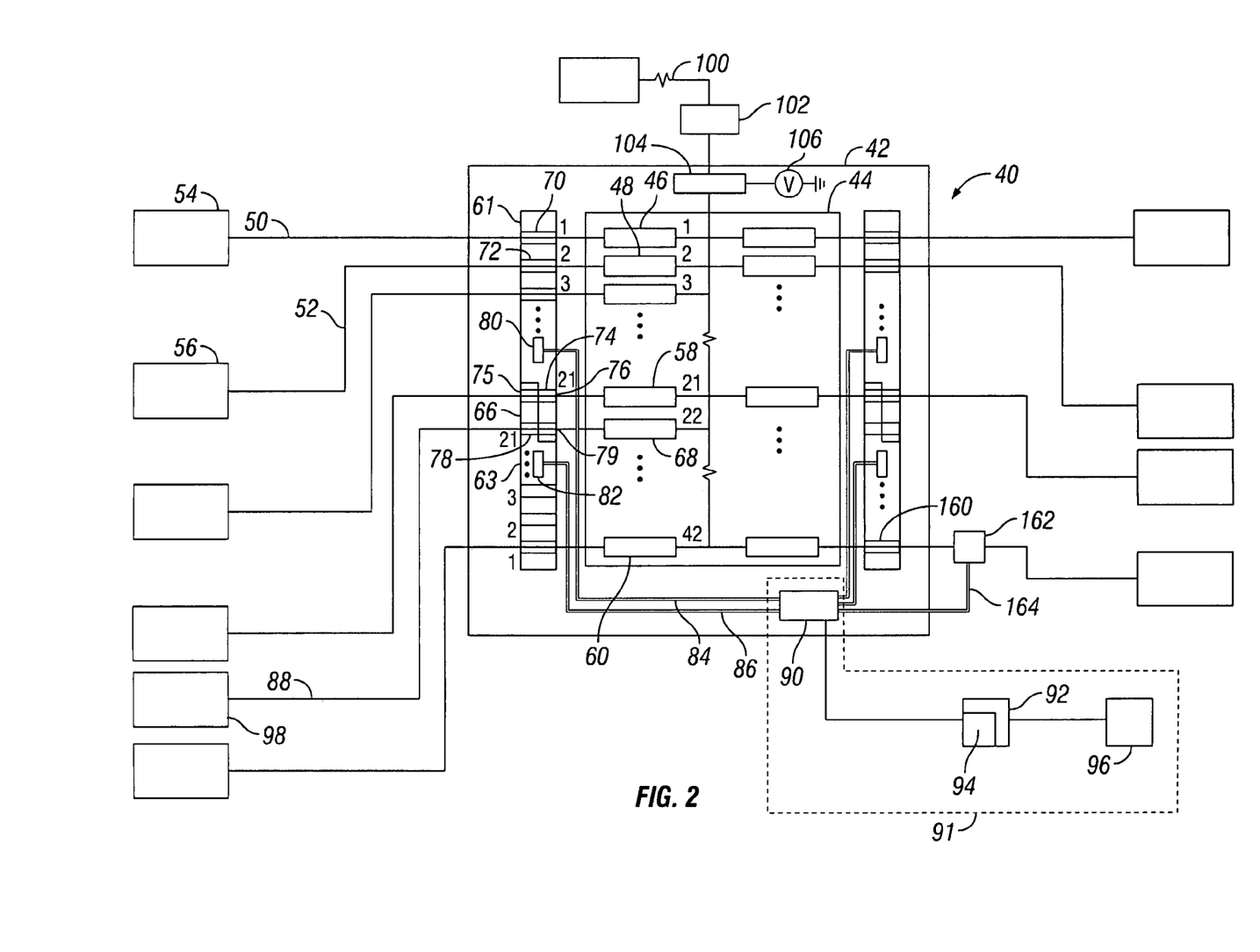
FIG. 2 is a schematic front view of an exemplary embodiment of an electrical system having a monitoring system according to the present disclosure.

FIG. 2 is a schematic front view of an exemplary prior art electrical branch monitoring system. The electrical system 40 generally includes a circuit breaker panel 42 having an internal space that houses a circuit breaker assembly 44 mounted thereto. The circuit breaker assembly 44 includes one or more circuit breakers, such as circuit breakers 46, 48, 58, 60, and 68. Generally, the circuit breakers are aligned in pre-established spaces on a circuit breaker assembly. It is customary for the electrical circuit breaker assembly to have 21 spaces for circuit breakers in a vertical alignment. Sometimes the circuit breaker assembly has a similar arrangement to the side of an additional 21 possible spaces for other circuit breakers.

Recently, some circuit breaker panels and associated circuit breaker assemblies have a vertical alignment of 42 circuit breakers for a more compact installation. The circuit breakers are generally numbered 1-21 or 1-42 on the panel to facilitate ready identification for maintenance, monitoring, or other functions. One or more electrical loads 54, 56, 98 are coupled to the circuit breakers through one or more wires 50, 52, 88. The wires provide power to the electrical loads.

The diagram illustrates one exemplary main power supply 100 providing power to the circuit breaker panel 42. It is known to those with ordinary skill in the art that for different power requirements, such as 240 volts, that two power feeds are required with one neutral, and for a 3-phase power system, three power feeds are required with one neutral, and other arrangements. For multiple power feeds, multiple circuit breakers can be coupled together for each circuit breaker connected to separate power feeds for a given electrical load. Thus, the present disclosure contemplates such arrangements and is specifically included within the scope of the disclosure and the claims that follow.

One or more sensor assemblies 61, 63, such as sensor modules to be further described below, can be generally disposed between the circuit breakers and the loads. Other sensor assemblies can include circuit boards, as modified herein, and other structures (herein "sensor supports") that can support one or more current transformers or other sensors attached thereto. Generally, the sensor assemblies 61, 63 will be mounted inside the circuit breaker panel 42 for safety, security, and protection of the sensor assemblies. The sensor assemblies can interface with each other in an interface area 66 described in more detail below. The sensor assemblies 61, 63 will generally include a plurality of circuit transformers (CTs), such as CTs 70, 72, 74, 78. In general, a CT is a wire wound toroidal coil on a conductive or nonconductive core. While it is envisioned that current transformers will be the principle sensor used on a sensor assembly, other types of sensors, such as voltage, power and other sensors, are included, and thus the term current transformer is used broadly to include such sensors. The CTs can have an aperture formed within the CT through which a power wire, such as wire 50, can be routed therethrough. The CTs can be specially coupled to the sensor assemblies as described below to reduce the bending stress caused by the wires 50, 52, 88, passing through the apertures of the respective CTs. As described herein, at least one embodiment of the sensor assemblies 61, 63, such as the sensor modules 62, 64, avoids the prior art problems of relying upon the CTs to absorb the bending stress 30, shown in FIGS. 1A, 1B.

Further, the sensor assemblies 61, 63 can include output connectors that can be coupled to a processor. For example, a first sensor assembly 61 can include a first output connector 80. The connector can be a multi-pin connector, used in electronic connections, having as many as 50 pins or more, to which the various wires from the sensors can be connected. The connectors can be coupled to the sensor assemblies through the underside of the sensor assemblies so that a corresponding connector can be inserted from a backside of the breaker panel. The connector 80 is shown schematically in FIG. 2 and is related to the position of an output connector block 81 shown in FIG. 3 in one embodiment. Alternatively, the connector 80 can be positioned on the front of the sensor assembly, on an end, or at other orientations as may be convenient. The first output connector 80 can be coupled to a monitoring system 91, having various components such as a processor 90, through a cable 84. In general, the output connector 80 will have output terminals for each of the CTs on the sensor assembly. Thus, cable 84 could be a ribbon cable, or other type of cable, such as an optical fiber cable, capable of discriminating between the outputs of different CTs. Similarly, a second sensor assembly 63 can likewise include an output connector 82 that can be electrically coupled to the monitoring system 91, such as the processor 90, through a cable 86. The processor 90 can process the output from the CTs into various types of output, such as data, reports, or signals for further processing useful to the monitoring system and/or the operator. Furthermore, additional processors, such as processor 92, can be coupled to the processor 90. The processors 90 and/or 92 can include a data memory storage 94 and can be coupled to an output device 96, such as a display, printer, transmitter, or other devices that can provide output in different formats.

In a similar fashion, the main power supply 100 can be coupled with a main circuit breaker 102. A main supply CT 104 can be coupled to the main power supply 100 to monitor aspects of the main power supply. In some embodiments, a voltmeter 106 can be coupled to one or more of the electrical conductors, such as the main power supply 100.

For some embodiments, where the circuit breaker assembly 44 includes circuit breakers 1-21, the first sensor assembly 61 can be used with its similar arrangement of 21 CTs. In other circuit breaker assemblies that have a greater number of circuit breakers 1-42, a plurality of sensor assemblies can be used, such as the embodiment illustrated in FIG. 2. The sensor assemblies 61, 63 can be interchangeable in that they each have a similar profile and can interchange with each other. Each sensor assembly could include at least 21 CTs so that together they can serve the 42 circuit breakers. The present disclosure solves at least two challenges in so doing. First, at least one of the sensor assemblies can be inverted for the two interchangeable sensor assemblies to interface, i.e., rotated so that its bottom is the top and top is the bottom in an end-to-end fashion, such as illustrated in FIG. 2. Thus, the CTs on sensor assembly 61 would number 1-21 from the top of the sensor assembly as viewed from the perspective to FIG. 2 to the bottom (i.e., from the output connector 82) while the inverted sensor assembly, such as sensor assembly 63, would number 21-1 from the top to the bottom, where the $1^{st}$ CT would start near the output connectors on each sensor assembly. Software, firmware, and/or hardware coupled to the output of the CTs would have conflicting identities of two sets of 1-21 CTs, as well as one of the sets being in a reversed number sequence. Further, if the inverted CT is measuring current, the current flowing through the CTs of the sensor assembly 63 would be a reverse current (i.e., negative) compared to a normal flow of current (i.e., positive) flowing through the CTs of the sensor assembly 61. The present disclosure can use the negative current advantageously using the software, firmware, and/or hardware the correct the CTs identities and to make adjustments for the inverted sensor support. Generally, when the monitoring system senses a reversed current, such as through the CTs of the inverted sensor assembly 63, the system recognizes the negative current as an inverted sensor assembly and can remaps the identities of the CTs to correspond to the correct circuit breakers. In the illustration of FIG. 2, the first CT of the sensor assembly 63 would become CT 42 to corresponding to the circuit breaker 60. Similarly, the $21^{st}$ CT of the sensor assembly 63, that is CT 78, would be mapped to the $22^{nd}$ circuit breaker, that is circuit breaker 68, and become the $22^{nd}$ CT to the monitoring system. Thus, CTs 21-1 would be re-identified as CTs 22-42, respectively, for the inverted sensor assembly to correspond with the circuit breakers 22-42. The software, firmware, and/or hardware of the present disclosure can perform such re-identification automatically.

In a similar fashion, individual CTs can indicate a reversal of current, generally inadvertently. For example, a sensor assembly could inadvertently have one or more CTs reversed during assembly and not discovered until the system is installed and operational. Likewise, one or more of the CTs can fail and need a secondary CT coupled to the respective power wire. The secondary CT could be installed inappropriately and indicate a reversed current. Thus, in a similar manner, the system can recognize the negative current as an inverted CT and translate the current as a positive current in conjunction with the other CTs associated with the sensor assembly or the system.

The second challenge solved by the present disclosure is in maintaining the spacing between the CTs and corresponding circuit breakers in the interface area 66. For example, the circuit breakers 58 and 68 are generally at fixed spacing intervals, dictated by the structure, the rails, and other pre-assembled aspects of the circuit breaker assembly 44. The close proximity of the spacing between the circuit breakers 58, 68 has heretofore been problematic in abutting two prior art assemblies such the circuit boards in the patents described in the Background. The abutment would cause a misalignment between the respective CT and its circuit breaker in the interface area, causing stress on the CT and the problems described above.

The present disclosure also solves this difficulty by overlapping at least one and generally two openings formed between the sensor assemblies and the respective circuit breaker(s). For example, the circuit breaker 58 could be the $21^{st}$ circuit breaker in the circuit breaker assembly 44 and the circuit breaker 68 could be the $22^{nd}$ circuit breaker in the circuit breaker assembly 44. Thus, both circuit breakers 58, 68 would be in proximity to the interface area 66 between the two sensor assemblies 61, 63. The CT 74 having an aperture 76 coupled to the second sensor assembly 63 can be aligned with the corresponding opening 75 formed in the first sensor assembly 61 where both the aperture and the opening can align with circuit breaker 58. Similarly, the CT 78 (e.g., the $21^{st}$ CT of the second sensor assembly 63) when inverted, could align with a corresponding opening 79 formed in the first sensor assembly 61 and the $22^{nd}$ circuit breaker 68. The alignment between the CTs and the interface includes one or more CTs in the interface area that overlap with a corresponding opening in the adjacent sensor assembly and allows wires to pass in alignment between the corresponding circuit breaker through the sensor assembly, and to the load. For example, a wire 88 coupled to the circuit breaker 68 could pass through the CT 78 and a corresponding opening 79 in the other sensor assembly and onto an electrical load 98. The CTs and openings can be on one sensor assembly, or on both sensor assemblies in the $21^{st}$ position of each sensor support.

Further, the disclosure can provide for those instances where a CT for a given wire fails to function. The present disclosure provides an alternative to disassembling the system 40 and the particular sensor assembly with a defective CT. The disclosure can provide a secondary CT and exclude an output of a CT coupled to the sensor assembly that otherwise would be used to monitor the conditions for that branch circuit. The software, firmware, or hardware can detect when abnormal conditions exists by for example, comparing with stored historical data or noting values lower or higher than predetermined values, and other metrics. The system can trigger an alarm, make adjustments, or otherwise alert an operator. For example, a CT 160 coupled to a sensor assembly could normally be used to monitor the conditions of branch wire 158. If CT 160 fails, the processor 90 can provide an output indicating the condition. A secondary CT 162 can be coupled for example by clamping the CT to the wire 158 without having to disconnect the wire 158. The CT 162 can be independently coupled to the monitoring system, such as to the processor 90 or a connector for the sensor assembly. The monitoring system 91 can exclude the output, automatically or selectively, from the defective CT 160 and use the output from the secondary CT 162 in substitution thereof and independent of the CT 160.

Figure 3:
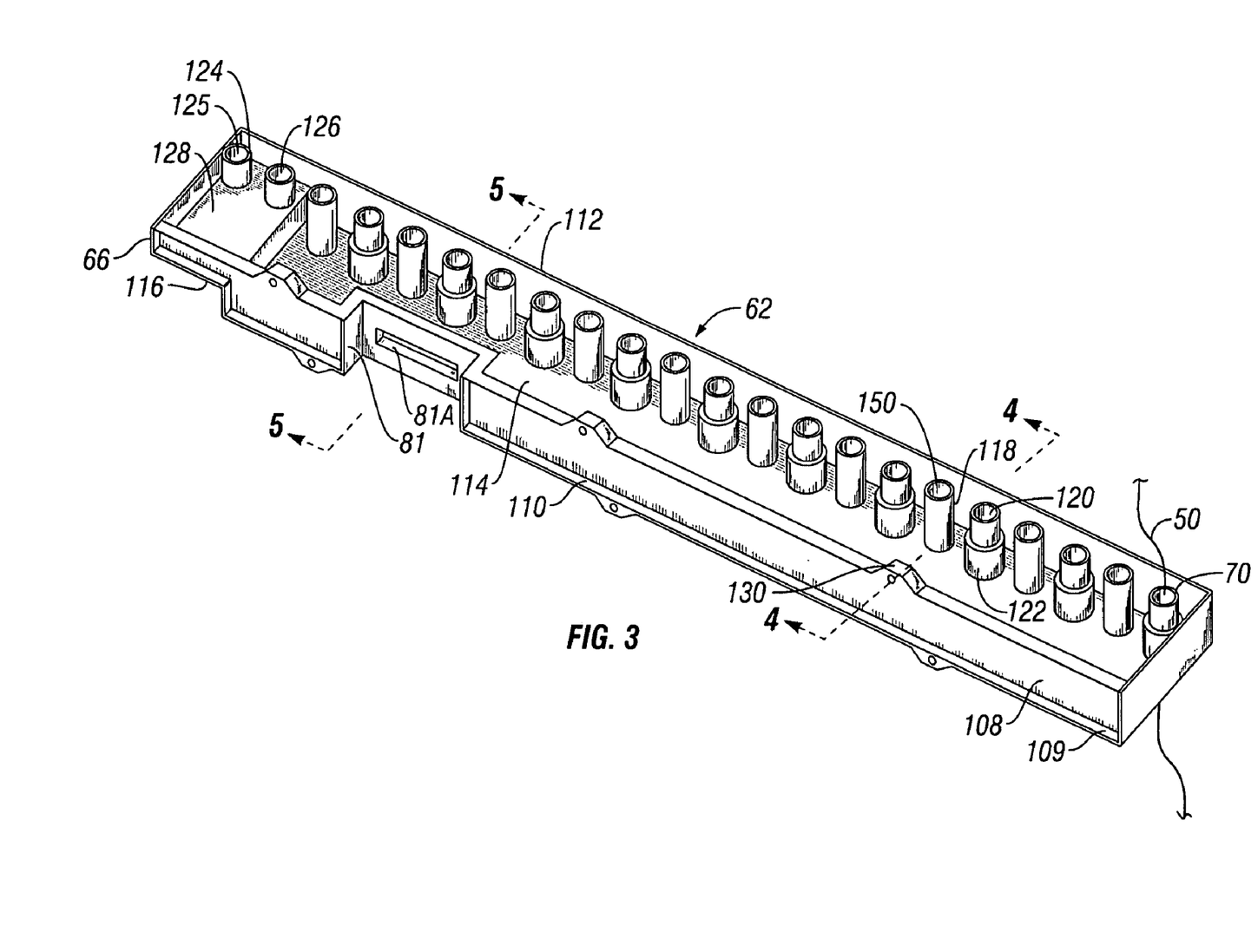
FIG. 3 is a perspective schematic view of one embodiment of a sensor module as an exemplary sensor support.

FIG. 3 is a perspective schematic view of one embodiment of a sensor module as an exemplary sensor assembly. The sensor assemblies 61, 63, described in FIG. 2, can comprise sensor modules 62, 64. In general, the term "sensor module" herein will include a sensor assembly having a relatively significant height from a plane upon which it is mounted in contrast to a circuit board with a relatively insignificant height above its plane of mounting. The sensor module generally has a sufficient height such that a wire from a circuit breaker can pass laterally (i.e., sideways) through the sensor module in contrast to the wire passing above it, as in prior efforts, measured from a plane on which the sensor module is mounted. The sensor module can advantageously be molded substantially as a unit or can be assembled from preformed sections.

The sensor module, such as the first sensor module 62, also shown in FIG. 2, is illustrated on its side to show the various portions thereof. For illustrative purposes and to provide a context to the figure, the wire 50, also shown in FIG. 2, is shown passing through the first CT 70, although certainly other orientations are possible. In general, the sensor module includes a first surface 108 that can provide a supporting surface for the module on a structure to which it is coupled. A second surface 109 is formed at an angle to the first surface to establish a height above the first surface for the sensor module. Advantageously, the height is of a dimension such that the wire 50 from a circuit breaker (shown in FIG. 6) mounted adjacent the sensor module can pass laterally through the sensor module in alignment with the circuit breaker, as described herein. Related structures such as a post with an opening, described below, can be laterally coupled to the second surface along its height and reduce or avoid the bending stresses from the wire passing therethrough. This structure is in contrast to prior efforts, using for example circuit boards of relatively insignificant height, resulting in such bending stresses.

The module can include a first portion 110 that is sufficiently wide to mount to a structure, such as the circuit breaker panel 42, shown in FIG. 2. The first portion can establish the supporting surface 108. One or more mounts 130, in at least one embodiment, can extend outwardly from the first portion of 110 as a tab with a mounting opening form and therethrough to further allow coupling of the first portion 110 to the panel 44. Other methods of mounting the sensor module such as retainers, adhesive, or other methods are contemplated. The sensor module 62 further includes a second portion 114 disposed at an angle to the first portion 110. The second portion can establish the second surface 109. In at least one embodiment for commercial efficiency, the second portion 114 can have a thinner cross-sectional area compared to the first portion 110 in the same direction. For example, and without limitation, the first portion 110 can include a flange having a greater width than height and the second portion 114 could be a web having a greater height than width. The flange provides a quantity of bending stiffness to the web across its smaller cross sectional dimension (i.e., thickness 166 shown in FIG. 4) and the web provides a quantity of bending stiffness to the flange across its smaller cross sectional dimension (i.e., thickness 168 shown in FIG. 4) when the flange and web are coupled together. In at least some embodiments, the sensor module 62 can further include a third portion 112. The third portion 112 can be similarly shaped as the first portion 110 and can also be a flange, although other shapes are contemplated. The sensor module further includes an output connector block 81 with an opening 81A, the block being coupled to the sensor module 62 to allow an output connector 80, shown in FIG. 2, to be assembled thereto.

The sensor module can further include a recessed portion 116. In at least one embodiment, the recessed portion 116 is adapted to allow an adjacent sensor module to be coupled thereto to form the interface area 66. Thus, the recessed portion 116 is generally symmetrical with the recessed portion of an adjacent module. Further, the sensor modules can be made interchangeable with each other, so that they can be inverted and still function in the intended manner as described herein.

The sensor module material can be any suitable material and if molded will be generally a polymer compound that can withstand some stresses. Advantageously, at least a portion of the sensor module is nonconductive. Exemplary materials for the sensor module are polymers, like polyesters, such as polyethylene terephthalate ("PET"), including PET (FR530), and polybutylene terephthalate ("PBT"), including PBT (4130). PBT is especially preferred since it is highly temperature resistant. Both materials are Underwriters Laboratories (UL) listed materials. Other structural materials, conductive and nonconductive can be used.

One or more CT posts for supporting the CTs can be coupled to the sensor module 62. In at least one embodiment, the posts are formed integrally therewith during a molding process. The posts, such as 118, have an opening 150 formed to allow the wire, such as wire 50, to be inserted therethrough. In general, the opening 150 will be aligned at an angle to the second portion 114. When assembled, such as shown in FIG. 2, the opening 150 will be aligned with its respective circuit breaker to allow the wire to be inserted through the opening and aligned with the corresponding circuit breaker. Thus, the height of the opening 150 above the first portion 110 in general will correspond to the height of the circuit breaker, such as circuit breaker 46, above the height of the panel 42 when the sensor module 62 is mounted to the panel 42. In at least one embodiment, the sensor module 62 can have 22 posts coupled thereto. The posts can allow for the customary 21 circuit breakers with the $22^{nd}$ post to be used in conjunction with an adjacent sensor module. More specifically, 21 posts in the sensor module 62 could have CTs (shown in FIGS. 4, 5) mounted thereto. In the embodiment shown in FIG. 3, the CTs could be disposed on any post between post 70 to post 126 for any correspond circuit breakers in the circuit breaker panel. Post 124 could be used to overlap with a CT mounted on a post of an adjacent sensor module (shown in FIG. 6) in the corresponding position as post 126 is on the first sensor module 62. Thus, an overlapping post 124 having an opening 125 has a general utility of allowing wire coming through a corresponding CT on an adjacent module through the opening 125 that can continue to the corresponding electrical load, such as shown in FIG. 2.

Figure 4:
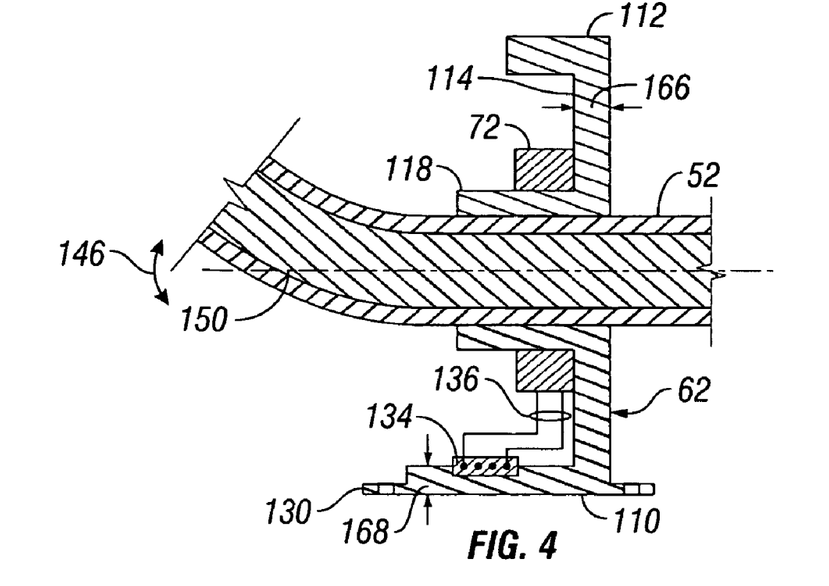
FIG. 4 is a cross sectional schematic view of the sensor module of FIG. 2 with a post and a current transformer coupled thereto.
Figure 5:
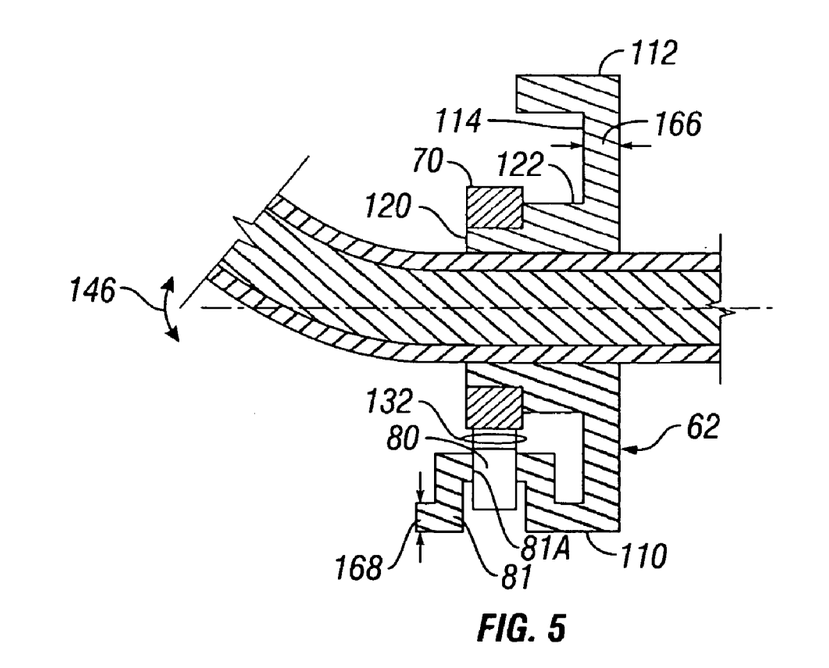
FIG. 5 is a cross sectional schematic view of the sensor module of FIG. 2 with a stepped post and a current transformer coupled thereto.

The posts can generally be aligned at a consistent vertical height to correspond to the height of the circuit breakers. Further, the spacing between the posts, such as posts 118, 120, are generally at the same spacing as the circuit breakers in the circuit breaker panel to maintain an alignment with the wires passing therethrough to the circuit breakers. The alignment helps reduce stresses on the wiring that in turn reduces stresses on the sensor module and circuit breakers. However, the general diameter of a CT is larger than can be accommodated with the restricted spacing between the posts. Thus, the CTs can be assembled to the sensor module in an alternating fashion as shown in FIGS. 4, 5 described below. To assist in accommodating the alternating arrangement, a step 122 can be formed or otherwise coupled on one or more posts to restrict the axial (i.e. lateral relative to the second portion 114) movement of the CT along the length of the post. For example, post 120 can be coupled with a step 122. Advantageously, the steps are included on alternating posts to assist in appropriate placing of the CTs for the particular post. In the interface area 66, the step can be provided by surface 128 to restrict the axial movement of the CT along the axis of the post.

FIG. 4 is a cross sectional schematic view of the sensor module of FIG. 3 with a post and a current transformer coupled thereto. The cross section is shown through the post 118 of FIG. 3 and through a portion of FIG. 6 with the addition of a CT and relevant wiring. The sensor module 62 generally includes a first portion 110, such as a flange, a second portion 114, such as a web, and in some embodiments, a third portion 112, such as an additional flange. In general, the first portion 110 can provide a mounting surface to some support structure, such as the circuit breaker panel 42, shown in FIG. 2. One or more mounts 130 can facilitate the mounting of the sensor panel 62 to a support structure. The shape of the sensor module 62 can vary significantly in size, height, orientation, relative widths, and thicknesses, and the illustration is only exemplary. In general, however, the sensor module will have a first portion of some dimensions and a second portion of some dimensions coupled to the first portion at some angle thereto so that an opening 150 formed through the second portion 114 can be adapted to align with the corresponding circuit breaker (shown in FIGS. 2, 6). This "height" above a plane on which the sensor module is mounted that is sufficiently high to allow the CTs to be laterally coupled thereto reduces the bending stresses on the CTs in contrast to bending stresses on the CTs mounted as shown in FIG. 1B. The post 118 can be formed integrally with the sensor module, such as by molding therewith, or otherwise coupled to the sensor module 62 and in general could be formed with the second portion 114. Importantly, the post 118 can absorb bending stress 146 caused by the wire 52 bending or otherwise attempting to misalign the opening 150 with the sensor module 62. Further, the posts transfer bending stresses from wires passing through the posts to the second portion 114 coupled with the posts, so that the second portion incurs stress in a shear stress mode that would tend to otherwise tear the second portion material. A shear stress mode can be structurally accommodated by the thickness of the second portion sufficient to resist tearing from the bending stresses. Thus, the connections of the CT to the sensor module are generally not unduly stressed, absent a catastrophic failure of the coupling portion of the sensor module, such as the posts with the CTs separating from the sensor module.

A CT 72 can be disposed about the post 118. In at least one embodiment, the CT 72 will be disposed around the post 118, so that the wire 52 is not in direct contact with the CT 72, that is, the post 118 provides a buffer structure between the CT 72 and any wire disposed through the opening 150. Thus, the CT 78 disposed distally from the wire 52 is generally not exposed to undue stress 146 as in prior efforts. If the post 118 does not have a step, as described in FIG. 3, then the CT will generally be disposed in proximity to the second portion 114.

Generally, the CT has a pair of output wires 136 to provide an output signal to the monitoring system, shown in FIG. 2. In at least one embodiment, the output wires 136 can be directly coupled to an output connector 80 without intermediate soldering connections other than at the output connector. Thus, the typical 126 soldering connections for 21 CTs found in prior art can be reduced to 42 soldering connections, a 67% decrease in soldering connections. It is believed that this reduction will result in inherently less failures. To facilitate the output wires 136 for each CT traveling to the connector 80, a wire channel 134 can be formed in the sensor module 62. For convenience, the wire channel 134 can be formed in the first portion 110. The number of output wires in the channel will vary depending upon the particular entry of the respective CT to the wire channel. In general, the maximum expected number of output wires in the wire channel will be about 42 to correspond to two output wires for 21 CTs, in at least one embodiment. Further, the wire channel 134 can be filled with an insulative material to seal the output wire from the CTs in the wire channel. Thus, the present disclosure provides an increased safety margin over prior art by maintaining the wire 52 carrying the power to the electrical load away from both the CT by way of the post 118 and the output wire 136 from the CT to a separate and in some cases sealed wire channel 134, with an attendant reduction in the number of solder connections and failure rates.

FIG. 5 is a cross sectional schematic view of the sensor module of FIG. 3 with a stepped post and a current transformer coupled thereto. FIG. 5 is illustrative of the cross section of the sensor module shown in FIG. 3 and FIG. 6 passing through a stepped post 120, having a step 122, with the addition of a CT and relevant wiring. Similar to the description regarding FIG. 4, the sensor module 62 includes the first portion 110, the second portion 114, and a third portion 112, in at least some embodiments. A post 120 is generally coupled to the second portion 114, where the post 120 has an opening formed therethrough that is generally aligned with a circuit breaker, such as the circuit breakers shown in FIGS. 2, 6. The post 120 can include a step 122. In some embodiments, the step can be formed integrally with the post 120 and in other embodiments, the step can simply be a cylinder or other geometric shaped component inserted at least partially around, over, attached to, or otherwise coupled with the post 120. In general, the step 122 will restrict the movement of a CT, such as CT 70, coupled to the post 120 in a direction along the axis of the opening through the post. The offset distance caused by the step 122 away from the second portion 114 on the post 120 can correspond to and allow for close spacing of the post 118, described in FIG. 4, and its respective CT 72 to maintain an axial alignment with circuit breakers at their close spacing. Output wires 132 extending from the CT 70 can be routed to and through the wiring channel 134 (shown in FIG. 4) that in at least one embodiment can be formed in the first portion 110. In this embodiment, similar to the embodiment shown in FIG. 4, the post 120 can isolate the CT 70 from the wire passing through the post 120. The isolation can occur electrically as well as mechanically, such that a bending stress 146 caused by the wire is generally absorbed by the post 120 and not the CT 70. Thus, the CT 70 and its output wires 132 are generally protected and subject to less system failure. The sensor module further includes an output connector block 81 with an opening 81A, the block being coupled to the sensor module 62 to allow an output connector 80, shown in FIG. 2, to be assembled thereto.

Figure 6:
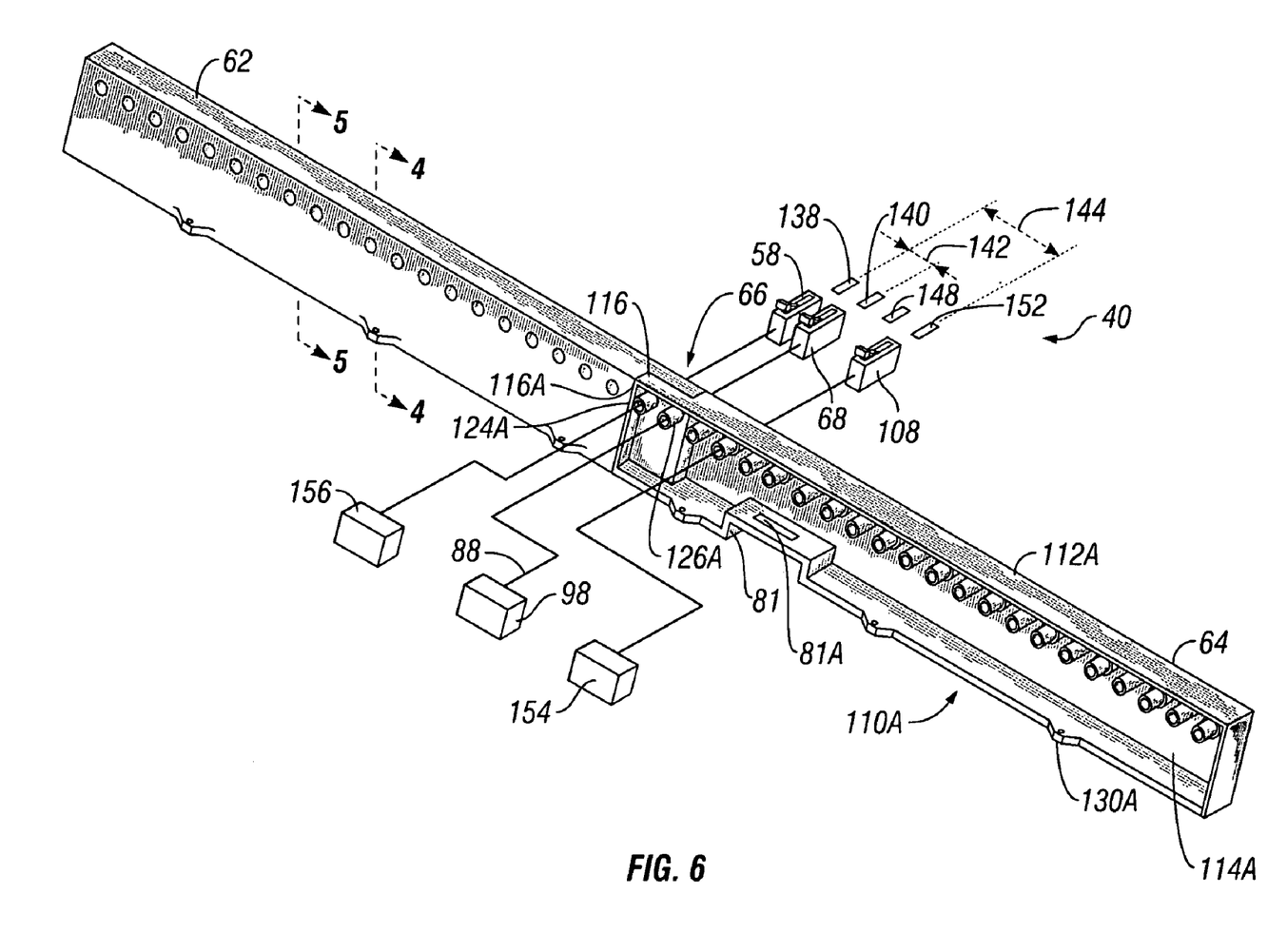
FIG. 6 is a perspective schematic view of interfaced sensor modules between a plurality of circuit breakers and respectively electrical loads.

FIG. 6 is a perspective schematic view of interfaced sensor modules between a plurality of circuit breakers and respective electrical loads. A first sensor module 62 can interface with a second sensor module 64. The second sensor module 64 can be interchangeable with the first sensor module 62. Each module can include an output connector 80, 82, respectively. The second sensor module generally will have a similar structure to the first sensor module so that it includes a first portion 110A, a second portion 114A, and a third portion 112A. Generally, the first and third portions will be a flange having a wider base than height and the second portion 114A will be a web having a larger height than width (i.e., thickness of the section). The first, second, and third portions can be molded as an integral unit in at least some embodiments. Further, the second sensor module will generally have a plurality of posts as has been described above and can be coupled to a support structure by, for example, coupling the first portion 110A to an electrical panel, shown in FIG. 2, and in some embodiments facilitated by a mount 130A.

The first sensor module 62 can include a recessed portion 116 that can be coupled to a corresponding recessed portion 116A of the second sensor module 64 in the interface area 66.

One or more circuit breakers 58, 68, 108 can be disposed in the electrical system 40. Generally, the circuit breakers will be disposed at a fixed relative spacing or an increment thereof. The spacing is generally determined by the factory-installed rails 138 and the spacing between the rails. The rails form a supporting surface for the circuit breakers to be inserted and generally clipped on or screwed thereto. For example, the rail 138 to which the circuit breaker 58 can be coupled thereto, is spaced at a unit spacing 142 from an adjacent rail 140 to which the circuit breaker 68 is coupled thereto. The electrical system may not require a circuit breaker to be coupled to rail 148 and may skip an interval to a rail 152 disposed at a spacing 144, incremental to the spacing 142. Generally and without limitation, the incremental spacing will occur in integers, such as one spacing, two spacings, and so forth, although fractional increments can be used, such as one-half and one-third spacings. The circuit breaker 108 coupled to the rail 152 can connect to a wire passing through the second sensor module for an electrical load 154. A wire 88 can be disposed between the circuit breaker 68 and a load 98. Similarly, a wire can be disposed between the circuit breaker 58 and a load 156. Generally, each wire will pass through a corresponding CT mounted in either the first sensor module 62 or the second sensor module 64. In the interface area 66, the wire could and generally does pass through both recessed portions of the sensor modules 62, 64. For example, in at least one embodiment, post 124A, 126A formed in the recessed portion 116A of the second sensor module 64 could be aligned with and overlap corresponding posts on the recessed portion 116 of the first sensor module 62, as described in reference to FIG. 3.

In at least one exemplary embodiment and without limitation, it is expected that the sensor modules would include 22 posts with the first 21 posts having CTs mounted thereon starting from the output connector on the end. The $22^{nd}$ post of each module would overlap with the corresponding $21^{st}$ CT of the other module. For example, a CT mounted on the post 126A of the second sensor module 64 would generally align with an opening through a post 126 (shown in FIG. 3) of the first sensor module 62. Likewise, the post 124A with its corresponding opening of the second sensor module 64 would align with the post 126 (shown in FIG. 3) and a CT mounted thereon of the first sensor module 62 in an overlapping fashion so that the wires from the circuit breakers to the respective loads could pass through both sensor modules in the interface area 66 and maintain alignment with the spacing 142 if circuit breakers were present in both locations.

While FIGS. 3-6 illustrate a non-limiting embodiment of the sensor module, the sensor assembly broadly described in FIG. 2 can include circuit boards and other structures that support the current transformers attached thereto.

Figure 7:
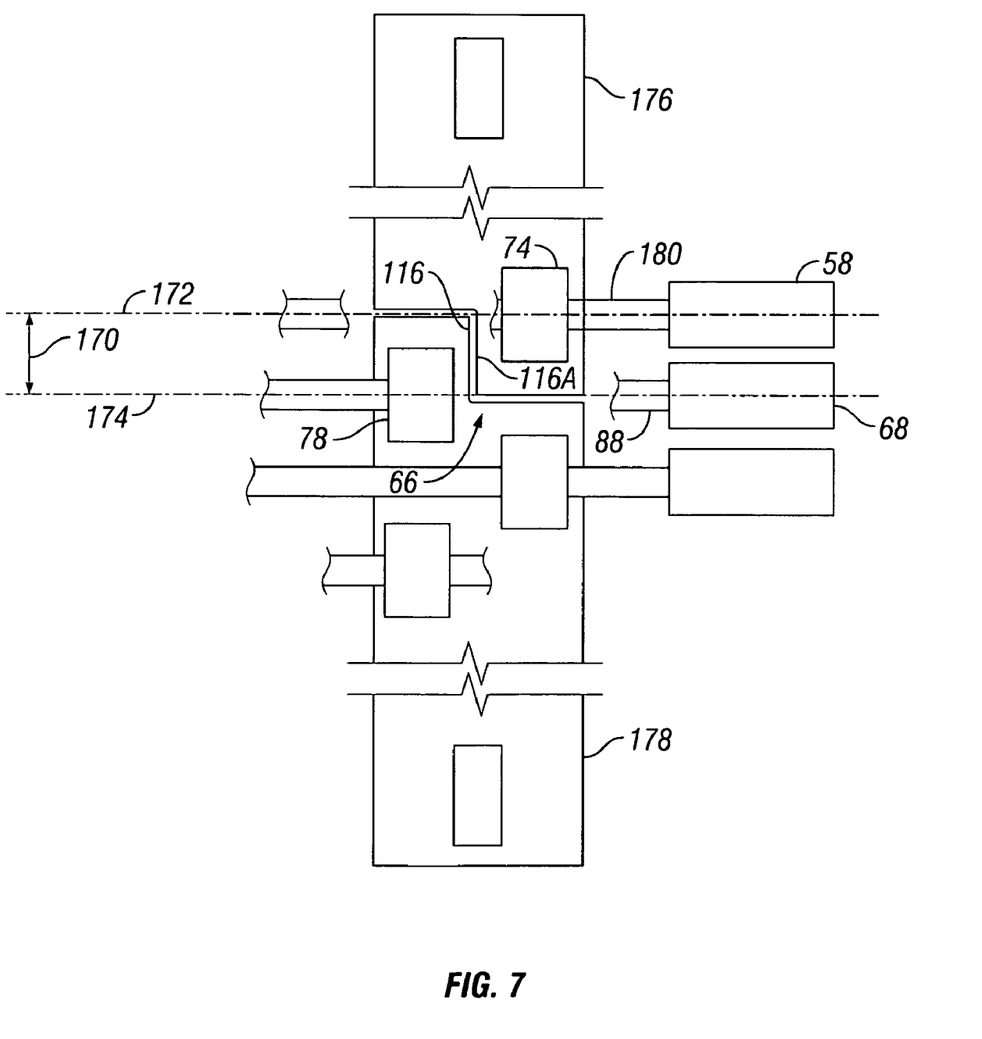
FIG. 7 is a perspective schematic view of one embodiment of a circuit board as an exemplary sensor support.

FIG. 7 is a perspective schematic view of one embodiment of a circuit board as an exemplary sensor support, having certain aspects taught in this disclosure. A circuit board 176 can include one or more CTs 74, 78 coupled thereto. The CTs can be coupled to the circuit board by soldering, fastening, forming, or other means. As described above, a plurality of circuit boards can be disposed adjacent each other in an end to end fashion to provide additional capacity for servicing a larger number of circuit breakers than individual circuit boards.

To solve the above referenced issue of alignment between the closely spaced circuit breakers 58, 68 and the CTs on the circuit boards at the ends of the circuit boards, an interface area 66 can be formed between the adjacent circuit boards 176, 178. The first circuit board 176 can include a recessed portion 116 and the second circuit board 178 can include a recessed portion 116A, similar to the recessed portions described above in reference to the sensor modules in FIGS. 3-6. The recessed portions can be substantially symmetrical between the circuit boards to allow interchangeability when inverting one or more of the circuit boards. The CTs 74, 78 can be mounted laterally relative to their respective recessed portions 116, 116A of their circuit boards. When the circuit boards 176, 178 are mounted adjacent each other end-to-end, the recessed portions 116, 116A can be laterally aligned in the interface area 66 in a side-by-side fashion and allow the CTs 74, 78 to maintain a relative alignment with the circuit breakers 58, 68. The CTs can be mounted laterally offset from each other on the circuit board to allow a closer axial spacing 170 between adjacent axes 172, 174 passing through the apertures than if mounted without the offset. Such alignment would otherwise be unavailable as in prior efforts because the dimensions of the CTs have not allowed sufficiently close spacing as the dimensions of the circuit breakers. Wires 78, 108 passing through CTs 74, 78, respectively, can be routed from the circuit breakers through the CTs 74, 78 in relative alignment and lessen associated bending stresses that otherwise can cause failures in the system.

Various basics of the invention have been explained herein. The various techniques and devices disclosed represent a portion of that which those skilled in the art would readily understand from the teachings of this application. Variations are possible and contemplated and are limited only by the claims. Details for the implementation thereof can be added by those with ordinary skill in the art. Such details may be added to the disclosure in another application based on this provisional application and it is believed that the inclusion of such details does not add new subject matter to the application. The accompanying figures may contain additional information not specifically discussed in the text and such information may be described in a later application without adding new subject matter. Additionally, various combinations and permutations of all elements or applications can be created and presented. All can be done to optimize performance in a specific application.

The various steps described herein can be combined with other steps, can occur in a variety of sequences unless otherwise specifically limited, various steps can be interlineated with the stated steps, and the stated steps can be split into multiple steps. Unless the context requires otherwise, the word "comprise" or variations such as "comprises" or "comprising", should be understood to imply the inclusion of at least the stated element or step or group of elements or steps or equivalents thereof, and not the exclusion of any other element or step or group of elements or steps or equivalents thereof.

Further, any documents to which reference is made in the application for this patent as well as all references listed in any list of references filed with the application are hereby incorporated by reference. However, to the extent statements might be considered inconsistent with the patenting of this invention such statements are expressly not to be considered as made by the applicant(s).

Also, any directions such as "top," "bottom," "left," "right," "upper," "lower," and other directions and orientations are described herein for clarity in reference to the figures and are not to be limiting of the actual device or system or use of the device or system. The device or system may be used in a number of directions and orientations.

The invention claimed is:

1. A sensor assembly for wiring in an electrical system, comprising:
   a. a sensor support having a recessed portion formed on at least one end of the sensor support and adapted to interface with an adjacent sensor support having a symmetrical recessed portion so that the recessed portions laterally overlap when the sensor supports are mounted end-to-end; and
   b. a plurality of current transformers coupled to the sensor support, with at least one current transformer mounted lateral to the recessed portion, the current transformers having apertures adapted to allow wiring to pass therethrough in alignment with one or more circuit breakers mounted in proximity to the sensor support.

2. The assembly of claim 1, wherein the sensor support comprises a circuit board.

3. The assembly of claim 1, wherein the current transformers are mounted laterally offset from each other to allow a closer axial spacing between adjacent axes of the current transformer apertures than if mounted without the offset.

4. The assembly of claim 1, wherein the current transformers comprise at least one output wire, and wherein the output wire from the current transformers is directly coupled to an output connector of the sensor support.

5. An electrical system, comprising:
   a. an electrical panel;
   b. a plurality of circuit breakers coupled to the electrical panel; and
   c. the sensor assembly of claim 1 coupled to the electrical panel.

6. The system of claim 5, further comprising the adjacent sensor support having the symmetrical recessed portion.

7. The system of claim 6, wherein the recessed portions of the first and second sensor supports are formed on a same relative end of the sensor supports and the interface is formed from inversion of the orientation of one of the sensor supports to align the recessed portions.

8. The system of claim 5, further comprising a monitoring system adapted to determine current flow through the current transformers.

9. The system of claim 8, wherein the monitoring system is adapted to adjust for reversal in indicated polarity from one or more current transformers indicating a reversed polarity.

10. The system of claim 9, wherein the monitoring system is adapted to change identities of the current transformers based on the reversal in the indicated polarity.

11. The system of claim 10, wherein a first sensor support comprises 21 current transformers identified as transformers 1-21 and a second sensor support comprises 21 other current transformers identified as transformers 1-21, wherein one of the sensor supports is inverted relative to the other sensor support that results in a reversal of indicated polarity of current through the inverted current transformers on the inverted sensor support, and wherein the current transformers coupled to the inverted sensor support are reidentified in the monitoring system as transformers 42-22, respectively, based on the reversal in the indicated polarity.

12. The system of claim 8, wherein a first current transformer is coupled to a wire and further comprising a second current transformer coupled to the same wire, the second current transformer being coupled to the monitoring system and the monitoring system adapted to receive input from the second current transformer on the same wire independent of the first current transformer.

13. The system of claim 12, wherein the second current transformer indicates a reversed polarity relative to other current transformers in the system and wherein the monitoring system is adapted to adjust for the reversal in indicated polarity from the second current transformer.

14. The system of claim 5, further comprising at least one processor to receive input from the current transformers.

15. The system of claim 5, further comprising an electrical load coupled to circuit breaker.

16. An electrical system, comprising:
   a. an electrical panel;
   b. a plurality of circuit breakers coupled to the electrical panel at an incremental spacing relative to each other;
   c. a first sensor support having a recessed portion formed on at least one end of the first sensor support;
   d. a second sensor support having a recessed portion formed on at least one end of the second sensor support and adapted to interface with the recessed portion of the first sensor support by inverting the second sensor support to allow lateral alignment of the recessed portions when the sensor supports are mounted end-to-end adjacent each other; and
   e. a plurality of current transformers coupled to the sensor supports, with at least one current transformer mounted lateral to at least one recessed portion of the first and second sensor supports, the current transformers having apertures adapted to allow wiring to pass therethrough in alignment with corresponding circuit breakers at the incremental spacing when mounted in proximity to the sensor supports.

17. The system of claim 16, wherein the sensor supports comprise circuit boards.

18. The system of claim 16, wherein the current transformers are mounted laterally offset from each other to allow a closer axial spacing between adjacent axes of the current transformer apertures than if mounted without the offset.

19. The system of claim 16, further comprising a monitoring system adapted to determine current flow through the current transformers.

20. The system of claim 19, wherein the monitoring system is adapted to adjust for reversal in indicated polarity from one or more current transformers indicating a reversed polarity.

21. The system of claim 20, wherein the monitoring system is adapted to change identities of the current transformers based on the reversal in the indicated polarity.

22. The system of claim 20, wherein the first sensor support comprises 21 current transformers identified as transformers 1-21 and the second sensor support comprises 21 other current transformers identified as transformers 1-21 and wherein the current transformers coupled to the inverted second sensor support are reidentified in the monitoring system as transformers 42-22, respectively, based on a reversal in the indicated polarity of current through the inverted second support current transformers caused by the inversion.

23. The system of claim 16, wherein a first current transformer is coupled to a wire and further comprising a second current transformer coupled to the same wire, the second current transformer being coupled to the monitoring system and the monitoring system adapted to receive input from the second current transformer on the same wire independent of the first current transformer.

24. The system of claim 23, wherein the second current transformer indicates a reversed polarity relative to other current transformers in the system and wherein the monitoring system is adapted to adjust for the reversal in indicated polarity from the second current transformer.

25. The system of claim 16, further comprising at least one processor to receive input from the current transformers.

26. The system of claim 16, further comprising an electrical load coupled to the circuit breaker.

* * * * *